(12) United States Patent
Sinquin et al.

(10) Patent No.: US 12,033,854 B2
(45) Date of Patent: Jul. 9, 2024

(54) METHOD FOR MANUFACTURING A COMPOSITE STRUCTURE COMPRISING A THIN LAYER OF MONOCRYSTALLINE SiC ON A CARRIER SUBSTRATE OF POLYCRYSTALLINE SiC

(71) Applicant: Soitec, Bernin (FR)

(72) Inventors: Yann Sinquin, Grenoble (FR); Jean-Marc Bethoux, La Buisse (FR); Damien Radisson, Brignoud (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 17/632,021

(22) PCT Filed: Jul. 2, 2020

(86) PCT No.: PCT/FR2020/051159
§ 371 (c)(1),
(2) Date: Feb. 1, 2022

(87) PCT Pub. No.: WO2021/019137
PCT Pub. Date: Feb. 4, 2021

(65) Prior Publication Data
US 2022/0270875 A1 Aug. 25, 2022

(30) Foreign Application Priority Data
Aug. 1, 2019 (FR) ...................................... 1908840

(51) Int. Cl.
*H01L 21/02* (2006.01)
(52) U.S. Cl.
CPC .. *H01L 21/02529* (2013.01); *H01L 21/02032* (2013.01); *H01L 21/02378* (2013.01);
(Continued)
(58) Field of Classification Search
None
See application file for complete search history.

(56) References Cited

U.S. PATENT DOCUMENTS

| 7,226,509 B2 | 6/2007 | Faure |
| 8,436,363 B2 | 5/2013 | Werkhoven et al. |

(Continued)

FOREIGN PATENT DOCUMENTS

| EP | 0594030 | 3/1996 |
| EP | 3168862 | 1/2016 |

(Continued)

OTHER PUBLICATIONS

Machine Translation of JP 6298926 B2; Published 2018 (Year: 2018).*

(Continued)

*Primary Examiner* — Suberr L Chi
*Assistant Examiner* — Carnell Hunter, III
(74) *Attorney, Agent, or Firm* — TraskBritt

(57) ABSTRACT

A method for producing a composite silicon carbide structure comprises:
providing an initial substrate of monocrystalline silicon carbide;
depositing an intermediate layer of polycrystalline silicon carbide at a temperature higher than 1000° C. on the initial substrate, the intermediate layer having a thickness greater than or equal to 1.5 microns;
implanting light ionic species through the intermediate layer to form a buried brittle plane in the initial substrate, delimiting the thin layer between the buried brittle plane and the intermediate layer, and
depositing an additional layer of polycrystalline silicon carbide at a temperature higher than 1000° C. on the intermediate layer, the intermediate layer and the additional layer forming a carrier substrate, and separating the buried brittle plane during the deposition of the additional layer.

14 Claims, 3 Drawing Sheets

(52) U.S. Cl.
CPC .... *H01L 21/0243* (2013.01); *H01L 21/02447* (2013.01); *H01L 21/02502* (2013.01)

(56) References Cited

U.S. PATENT DOCUMENTS

| | | | |
|---|---|---|---|
| 9,716,029 | B2 | 7/2017 | Lallement et al. |
| 2017/0213735 | A1 | 7/2017 | Imaoka et al. |
| 2018/0047630 | A1 | 2/2018 | Kato et al. |
| 2018/0251910 | A1* | 9/2018 | Akiyama .............. C23C 16/325 |
| 2018/0251911 | A1 | 9/2018 | Kubota et al. |
| 2018/0330983 | A1 | 11/2018 | Wang et al. |

FOREIGN PATENT DOCUMENTS

| | | | |
|---|---|---|---|
| EP | 3349237 | B1 | 10/2021 |
| JP | 10-297996 | A | 11/1998 |
| JP | 11-228296 | A | 8/1999 |
| JP | 2010-541230 | A | 12/2010 |
| JP | 2017-057102 | A | 3/2017 |
| JP | 6298926 | B2 * | 3/2018 ............. B23K 26/57 |
| JP | 6298926 | B2 | 3/2018 |
| JP | 2019-501523 | A | 1/2019 |
| TW | 200607023 | A | 2/2006 |
| TW | I269371 | B | 12/2006 |
| TW | 201807805 | A | 3/2018 |
| TW | I630642 | A | 7/2018 |
| WO | 2016/006663 | A1 | 1/2016 |
| WO | 2017/104291 | A1 | 6/2017 |

OTHER PUBLICATIONS

Mu et al., (Invited) Room Temperature Wafer Bonding of Wide Bandgap Semiconductors, ECS Transactions, vol. 86, No. 5, (2018), pp. 3-21.
International Search Report for International Application No. PCT/FR2020/051159 dated Oct. 13, 2020, 2 pages.
International Written Opinion for International Application No. PCT/FR2020/051159 dated Oct. 13, 2020, 5 pages.
Singapore Written Opinion for Application No. 11202200337X dated Jul. 21, 2023, 13 pages.
Taiwanese Office Action for Application No. 1121223660 dated Dec. 4, 2023, 6 pages with machine translation.
Korean Notice of Non-Final Rejection for Application No. 10-2022-7003588 dated Jan. 15, 2024, 6 pages.
Japanese Notice of Reasons for Rejection for Application No. 2022-502071 dated Mar. 19, 2024, 2 pages.

* cited by examiner

METHOD FOR MANUFACTURING A COMPOSITE STRUCTURE COMPRISING A THIN LAYER OF MONOCRYSTALLINE SiC ON A CARRIER SUBSTRATE OF POLYCRYSTALLINE SiC

CROSS-REFERENCE TO RELATED APPLICATIONS

This application is a national phase entry under 35 U.S.C. § 371 of International Patent Application PCT/FR2020/051159, filed Jul. 2, 2020, designating the United States of America and published as International Patent Publication WO 2021/019137 A1 on Feb. 4, 2021, which claims the benefit under Article 8 of the Patent Cooperation Treaty to French Patent Application Serial No. 1908840, filed Aug. 1, 2019.

TECHNICAL FIELD

The present disclosure relates to the field of semiconductor materials for microelectronic components. The present disclosure relates to, in particular, a process for producing a composite structure comprising a thin layer of monocrystalline silicon carbide on a carrier substrate made of polycrystalline silicon carbide.

BACKGROUND

Interest in silicon carbide (SiC) has increased considerably over the last few years because this semiconductor material is able to increase the capacity to handle energy. SiC is increasingly widely used to produce innovative power devices to meet the needs of rising fields in electronics, such as, in particular, electric vehicles.

Power devices and integrated power supply systems based on monocrystalline silicon carbide are able to manage a much higher energy density with respect to their traditional silicon homologues, and to do so with smaller active-zone dimensions. To limit the dimensions of power devices on SiC still further, it is advantageous to produce vertical instead of lateral components. For this, vertical electrical conduction, between an electrode arranged on the front face of the SiC structure and an electrode arranged on the back face, must be allowed by the structure.

However, monocrystalline SiC substrates intended for the microelectronics industry are still expensive and difficult to supply at a large size. It is therefore advantageous to make use of thin-layer transfer solutions to produce composite structures, which typically comprise a thin layer of monocrystalline SiC on a less expensive carrier substrate. One well-known thin-layer transfer solution is the Smart Cut™ process, based on implanting light ions and joining by direct bonding. Such a process makes it possible, for example, to produce a composite structure comprising a thin layer of monocrystalline SiC (c-SiC), taken from a c-SiC donor substrate, in direct contact with a carrier substrate made of polycrystalline SiC (p-SiC), and allowing vertical electrical conduction. However, it remains difficult to achieve high-quality direct bonding by molecular adhesion between two substrates made of c-SiC and p-SiC, since managing the surface state and roughness of the substrates is complex.

Various methods derived from this process are also known from the prior art. For example, F. Mu et al (ECS Transactions, 86 (5) 3-21, 2018) implement direct bonding after activating the surfaces to be joined by bombardment with argon (SAB for "surface activation bonding"): such treatment prior to bonding generates a very high density of dangling bonds, which promote the formation of covalent bonds at the joining interface, and hence a high bonding energy. However, this method has the drawback of generating an amorphous layer at the surface of the monocrystalline SiC donor substrate, which negatively affects vertical electrical conduction between the thin layer of c-SiC and the carrier substrate made of p-SiC.

Solutions have been proposed to solve this problem, in particular, in EP patent application 3168862, implementing an implantation of dopant species into the amorphous layer in order to restore its electrical properties. The main drawback of this approach is its complexity and hence its cost.

U.S. patent application 8436363 describes a process for producing a composite structure comprising a thin layer of c-SiC arranged on a metal carrier substrate, the coefficient of thermal expansion of which is matched to that of the thin layer. This production process comprises the following steps:
    forming a buried brittle plane in a c-SiC donor substrate, delimiting a thin layer between the buried brittle plane and a front surface of the donor substrate,
    depositing a layer of metal, for example, of tungsten or of molybdenum, on the front surface of the donor substrate to form the carrier substrate with sufficient thickness to perform a stiffening function, and
    separating along the buried brittle plane to form, on the one hand, the composite structure comprising the metal carrier substrate and the thin layer of c-SiC and, on the other hand, the rest of the c-SiC donor substrate.

However, such a production process is incompatible when the material forming the carrier substrate is p-SiC, which requires deposition at temperatures above 1000° C., for example, at 1200° C.: specifically, at these high temperatures, the growth kinetics of the cavities present in the buried brittle plane are faster than the growth kinetics of the p-SiC layer and the thickness required for a stiffening effect is not reached before blistering starts to occur, which is related to the deformation of the layer vertically in line with the cavities.

It should be noted that depositing p-SiC at high temperatures (>1000° C.) is particularly advantageous in that it confers structural properties (grain size, crystal orientations, etc.) that are favorable for good electrical conduction, good thermal conduction and a coefficient of thermal expansion very close to that of c-SiC on the deposited p-SiC layer: the properties typically expected for an SiC-based substrate intended for accommodating power devices. High deposition temperatures are also advantageous in that they allow high growth speeds.

BRIEF SUMMARY

The present disclosure relates to a solution as an alternative to those of the prior art, and aims to completely or partly overcome the aforementioned drawbacks. The present disclosure relates to, in particular, a process for producing a composite structure comprising a thin layer of c-SiC arranged on a carrier substrate made of p-SiC resulting from high-temperature deposition.

The present disclosure relates to a process for producing a composite structure comprising a thin layer of monocrystalline silicon carbide arranged on a carrier substrate made of polycrystalline silicon carbide. The process comprises:
    a step of providing an initial substrate made of monocrystalline silicon carbide, a first deposition step at a temperature higher than 1000° C. to form an intermediate layer of polycrystalline silicon carbide on the initial substrate, the thickness of the intermediate layer being greater than or equal to 1.5 microns, a step of implanting light ionic species through the intermediate layer to form a buried brittle plane in the initial substrate, delimiting the thin layer between the buried brittle plane and the intermediate layer, and a second deposition step at a temperature higher than 1000° C. to form an additional layer of polycrystalline silicon carbide on the intermediate layer, the intermediate layer and the additional layer forming the carrier substrate, a separation along the buried brittle plane taking place during the second deposition step.

According to other advantageous and non-limiting features of the present disclosure, considered alone or according to any technically feasible combination:

the first deposition step and the second deposition step are carried out by chemical vapor deposition at a temperature between 1000° C. and 1600° C., preferably between 1200° C. and 1600° C.;

the first deposition step and the second deposition step are carried out at the same temperature;

the first deposition step and/or the second deposition step are carried out starting from chlorinated precursors;

upon completion of the first deposition step, the thickness of the intermediate layer is greater than or equal to 3 microns, or even greater than or equal to 5 microns;

the implanted light species are chosen from hydrogen and/or helium;

the hydrogen ions are implanted at an energy between 260 keV and 2000 keV, and at a dose between $5^E16/cm^2$ and $1^E17/cm^2$;

the process comprises, before the first deposition step, a step of preparing the initial substrate including at least one operation of deoxidizing a front surface of the initial substrate;

the process comprises, after the second deposition step, finishing steps applied to the composite structure, the steps including chemical-mechanical polishing of a free face of the thin layer and/or chemical-mechanical polishing of a free face of the carrier substrate; and the chemical-mechanical polishing of the thin layer and of the carrier substrate is carried out simultaneously by using double-sided polishing equipment.

BRIEF DESCRIPTION OF THE DRAWINGS

Other features and advantages of the present disclosure will become apparent from the following detailed description of the present disclosure, which description is given with reference to the accompanying figures, in which.

DETAILED DESCRIPTION

In the description, the same reference signs in the figures will be used for elements of the same type. The figures are schematic representations that, for the sake of legibility, are not to scale. In particular, the thicknesses of the layers along the z-axis are not to scale with respect to the lateral dimensions along the x- and y-axes; and the relative thicknesses of the layers with respect to one another are not necessarily respected in the figures.

Figure 1:
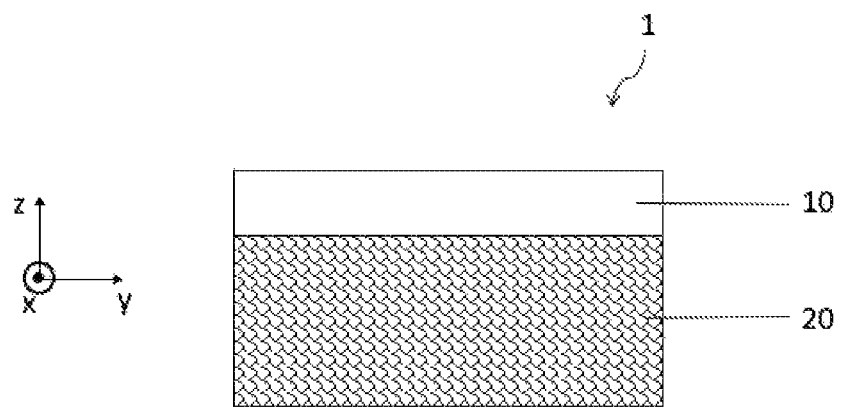
FIG. 1 shows a composite structure produced following a production process according to the present disclosure.

The present disclosure relates to a process for producing a composite structure 1 comprising a thin layer 10 of monocrystalline silicon carbide arranged on a carrier substrate 20 made of polycrystalline silicon carbide (FIG. 1).

Figure 2A:
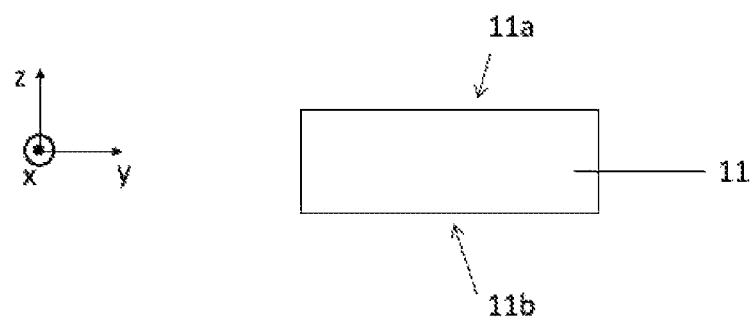
FIGS. 2A to 2F show steps of a production process according to the present disclosure.

The process firstly comprises a step of providing an initial substrate 11 made of monocrystalline silicon carbide (FIG. 2A). Throughout the rest of the description, "c-SiC" will be used to refer to monocrystalline silicon carbide.

The initial substrate 11 preferably takes the shape of a wafer having a diameter of 100 mm or 150 mm, or even 200 mm, and a thickness typically between 300 and 800 microns. It has a front face 11a and a back face 11b. The surface roughness of the front face 11a is advantageously chosen to be lower than 1 nm Ra, average roughness, measured by atomic force microscopy (AFM) in a scan of 20 microns×20 microns.

The thin layer 10 of c-Si of the composite structure 1 will be formed, upon completion of the process of the present disclosure, starting from the initial substrate 11; thus, the crystal orientation, crystal quality and the level of doping of the initial substrate 11 are chosen so as to meet the required specifications of the vertical components to be formed on the thin layer 10. Typically, the initial substrate 11 made of c-SiC is of the 4H or 6H polytype, with an offcut angle smaller than 4.0° with respect to the <11-20> crystallographic axis ±0.5°, and a micropipe density lower than or equal to 5/cm², or even 1/cm². N– (nitrogen-)doped, it preferably exhibits a resistivity between 0.015 ohm·cm and 0.030 ohm·cm. Optionally, it will be possible to choose an initial substrate 11 exhibiting a low density of BPDs (basal plane dislocations), typically lower than or equal to 1500/cm² according to the sensitivity of the components to these defects.

Alternatively, the initial substrate 11 may include a surface layer on its front face 11a, produced by, for example, epitaxy, and exhibiting the required properties for a future thin layer 10 that will be formed, upon completion of the process of the present disclosure, starting from the surface layer.

Figure 2B:
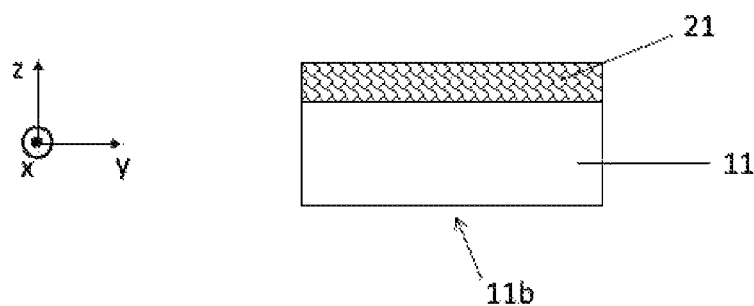

The process comprises a first step of deposition at a temperature higher than 1000° C. to form an intermediate layer 21 of p-SiC on the front face 11a of the initial substrate 11 (FIG. 2B). The thickness of the intermediate layer 21 is greater than 1.5 microns. Advantageously, the thickness of the intermediate layer 21 is greater than or equal to 3 microns, or even greater than or equal to 5 microns. This minimum thickness is defined so as to confer a stiffening function on the intermediate layer 21 sufficient for a later, second step of the process, as will be described further below.

Preferably, the thickness of the intermediate layer 21 is kept below 30 microns, so as to limit the implantation energy needed to pass through the layer in a subsequent step of the process.

This first deposition is advantageously performed using a chemical-vapor-deposition (CVD) technique on the basis of chlorinated precursors and at a temperature between 1000° C. and 1600° C. More advantageously still, the temperature of deposition is between 1200° C. and 1600° C., as proposed in the document by Chichignoud et al ("Chlorinated silicon carbide CVD revisited for polycrystalline bulk growth," Volume 201, Issues 22-23, 25 Sep. 2007, Pages 8888-8892, Surface and Coatings Technology). The parameters of the first deposition are determined such that the intermediate layer 21 exhibits good electrical conductivity, namely between 0.015 and 0.03 ohm·cm, high thermal conductivity, namely higher than or equal to 200 W·m$^{-1}$·K$^{-1}$, and a coefficient of thermal expansion similar to that of the thin layer 10, namely typically between $3.8^E$–6/K and $4.2^E$–6/K at ambient temperature.

To obtain these properties, it will be possible, for example, for the intermediate layer 21 to exhibit the following structural characteristics: 3C SiC grains, 111 orientation, average size of 1 to 10 μm, N-doped for a final resistivity lower than or equal to 0.03 ohm·cm.

Figure 2C:
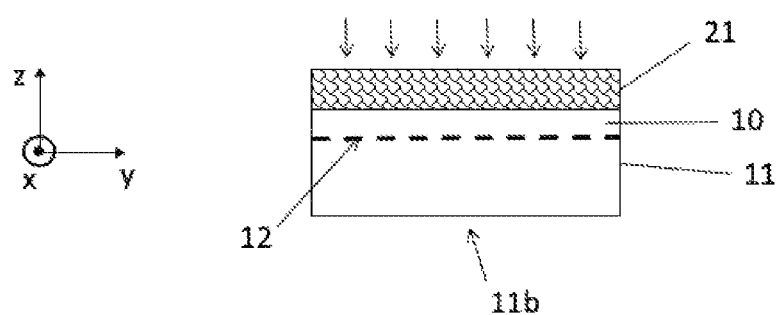

The production process according to the present disclosure further comprises a step of implanting light ionic species through the intermediate layer 21 down to a given depth in the initial substrate 11. This implantation creates a buried brittle plane 12 in the initial substrate 11 (FIG. 2C).

The implanted light species are preferably hydrogen, helium or these two species co-implanted. As is well known with reference to the Smart Cut™ process, these light species will form, around the given depth, microcavities distributed in a thin layer parallel to the free surface of the intermediate layer 21, i.e., parallel to the plan (x,y) in the figures. This thin layer will be called the buried brittle plane, for the sake of simplicity.

The buried brittle plane 12 delimits the future thin layer 10, with the front face of the initial substrate 11. In other words, the thin layer 10 of the composite structure 1 that will be obtained upon completion of the production process is, at this stage, arranged between the buried brittle plane 12 and the intermediate layer 21.

The energy of implantation of the light species is chosen so that they pass through the intermediate layer 21 and reach the given depth in the initial substrate 11, the depth corresponding to a target thickness of the thin layer 10.

Typically, hydrogen ions will be implanted at an energy between 260 keV and 2000 keV, and at a dose between $5^E16/cm^2$ and $1^E17/cm^2$, in order to pass through an intermediate layer 21 of 1.5 micron to 30 microns and delimit a thin layer 10 of about 100 to 1500 nm.

It should be noted that a protective layer could be deposited on the free face of the intermediate layer 21 prior to the ion implantation step. This protective layer may comprise a material such as silicon oxide or silicon nitride, for example.

Figure 2D:
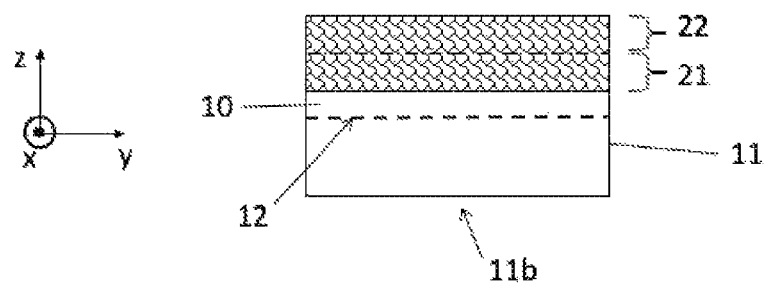

The production process lastly comprises a second step of deposition at a temperature higher than 1000° C. to form an additional layer 22 of p-SiC on the intermediate layer 21 (FIG. 2D).

The second deposition is advantageously performed using a chemical-vapor-deposition (CVD) technique on the basis of chlorinated precursors and at a temperature between 1000° C. and 1600° C. More advantageously still, as for the first deposition, the temperature of deposition is between 1200° C. and 1600° C. Similarly to the first deposition, the parameters of the second deposition are determined such that the additional layer 22 exhibits good electrical conductivity, namely between 0.015 and 0.03 ohm·cm, high thermal conductivity, namely higher than or equal to 200 W·m$^{-1}$·K$^-$1, and a coefficient of thermal expansion similar to that of the thin layer 10, namely typically between $3.8^E$–6/K and $4.2^E$–6/K at ambient temperature.

It will be possible for the temperature and conditions of the second deposition to be identical to or different from those of the first deposition, the objective being to obtain the electrical, thermal and mechanical properties mentioned above for the additional layer 22.

As presented above for the intermediate layer 21, to obtain these properties, it will be possible, for example, for the additional layer 22 to exhibit the following structural characteristics: 3C SiC grains, 111 orientation, average size of 1 to 10 μm, N-doped for a final resistivity lower than or equal to 0.03 ohm·cm.

The assembly formed by the intermediate layer 21 and by the additional layer 22 is intended to form the carrier substrate 20 of the composite structure 1. The electrical, thermal and mechanical properties presented above will therefore be provided for the carrier substrate 20, thus meeting the expected specifications for vertical power devices.

The target final thickness of the carrier substrate 20 is within a range typically from 50 microns to 300 microns.

Figure 2E:
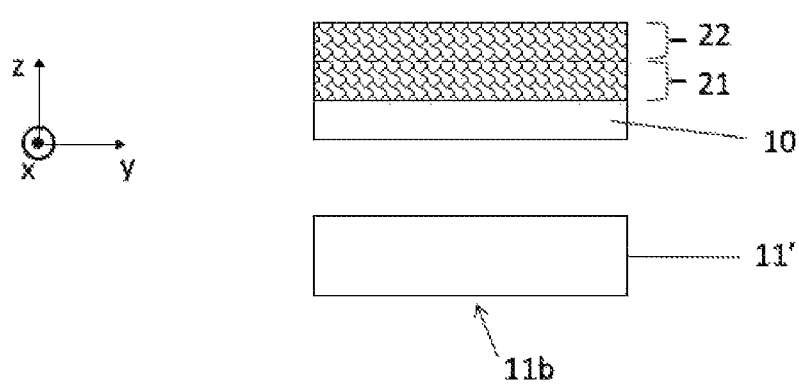

During the second deposition step, because of the thermal budget applied to the structure formed by the initial substrate 11, the intermediate layer 21 and the growing additional layer 22, a separation along the buried brittle plane 12 will take place (FIG. 2E). Specifically, the microcavities present in the buried brittle plane 12 follow growth kinetics until the initiation of a fracture wave that will propagate across the entire extent of the buried brittle plane 12 and result in the separation between the assembly formed of the thin layer 10, of the intermediate layer 21 and of the additional layer 22 and the rest of the initial substrate 11'.

Figure 2F:
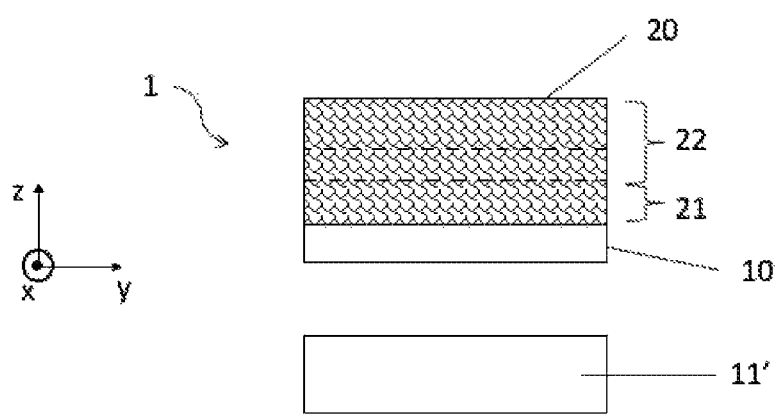

According to a first variant, separation takes place before the additional layer 22 has reached its target thickness. Regardless of the thickness of the additional layer 22 when separation takes place, the fracture wave will propagate across the entire extent of the buried brittle plane 12 because the intermediate layer 21 is sufficiently thick by itself to provide the stiffening effect: the cavities therefore do not deform the layer with blistering. The second deposition may then continue until the target thickness of the additional layer 22 is reached and the final composite structure 1 is obtained (FIG. 2F). The sum of the target thickness of the additional layer 22 and of the thickness of the intermediate layer 21 constitutes the final thickness of the carrier substrate 20.

According to a second variant, separation takes place substantially at the moment when the additional layer 22 reaches its target thickness.

It is well understood that separation will take place according to the first or second variants presented above according to the implantation parameters, the temperature of the second deposition and the target thickness of the additional layer 22 (which determines the duration of the second deposition).

Advantageously, the production process comprises, before the first deposition step and/or before the second deposition step, a step of preparing the initial substrate 11 including at least one sequence of deoxidizing the front face of the initial substrate 11. It will be possible, for example, for this sequence to be carried out through immersion in a bath of hydrofluoric acid (HF) or through exposure to HF vapors. The preparation step may also comprise cleaning sequences in order to remove all or some, metal or organic, particulate contaminants that may be present on the faces 11a, 11b of the initial substrate 11.

According to one advantageous embodiment, the production process comprises finishing steps applied to the final composite structure 1 obtained upon completion of the second deposition step. These finishing steps aim, in particular, to improve the roughness of the free surface of the thin layer 10 (front face of the final composite structure 1) and potentially the roughness of the free face of the additional layer 22 (back face of the final composite structure 1). Specifically, after separation, the free face of the thin layer 10 typically exhibits a roughness between 3 and 6 nm Ra (AFM—20 micron×20 micron scan). The objective for the later production of components is to have a roughness lower than 1 nm Ra. Regarding the back face of the final composite structure 1, the roughness upon completion of the second deposition is typically higher than 10 nm Ra, or even higher than 100 nm Ra; the target objective is usually to lower the roughness to less than 3 nm Ra.

The finishing steps may employ, in particular, known chemical-mechanical polishing techniques, applied to the front face of the final composite structure 1, to its back face, or to both faces simultaneously by using two-sided polishing equipment. It will be possible for the polishing process to differ between the front face and the back face, the smoothing of a c-SiC surface and of a p-SiC surface usually requiring different consumables.

EXAMPLE

According to one non-limiting exemplary implementation, the initial substrate 11 provided in the first step of the production process is a wafer made of c-SiC of 4H polytype, with an orientation of 4.0° with respect to the <11-20> axis ±0.5°, with a diameter of 150 mm and a thickness of 350 μm.

A conventional RCA cleaning sequence (Standard Clean 1+Standard Clean 2) followed by Caro's acid (mixture of sulfuric acid and hydrogen peroxide) and then HF (hydrofluoric acid) is carried out on the initial substrate 11 prior to the first deposition step. CVD on the basis of chlorinated precursors at a temperature of 1200° C. is carried out on the front face 11a of the initial substrate 11, creating an intermediate layer 21 with a thickness of 5 microns after 6 min (deposition speed: 50 μm/h).

Hydrogen ions are implanted at an energy of 650 keV and a dose of $6^E16$ H+/cm$^2$ through the free surface of the intermediate layer 21. A buried brittle plane 12 is thus created at a depth of about 600 nm in the initial substrate 11.

A cleaning sequence of RCA+Caro's acid is carried out on the structure so as to remove potential contaminants from the free face of the intermediate layer 21.

A second CVD is carried out on the intermediate layer 21 at a temperature of 1200° C. for 355 minutes so as to achieve a target thickness of 300 microns (sum of the thickness of the intermediate layer 21 and of the additional layer 22). Separation takes place at the level of the buried brittle plane 12 during the deposition. Upon completion of the second deposition, the composite structure 1 formed of the thin layer 10 and of the carrier substrate 20 is separated from the rest of the initial substrate 11.

Double-sided polishing may be carried out to restore the surface roughness of the thin layer 10 and of the back face of the carrier substrate 20 (free face of the additional layer 22).

Of course, the present disclosure is not limited to the described embodiments and examples, and variant embodiments thereof may be envisaged that do not depart from the scope of the invention such as defined by the claims.

The invention claimed is:

1. A method for producing a composite structure comprising a thin layer of monocrystalline silicon carbide on a carrier substrate made of polycrystalline silicon carbide, the method comprising:
   providing an initial substrate comprising monocrystalline silicon carbide;
   depositing an intermediate layer of polycrystalline silicon carbide at a temperature higher than 1000° C. on the initial substrate, a thickness of the intermediate layer being greater than or equal to 1.5 microns;
   implanting light ionic species through the intermediate layer to form a buried brittle plane in the initial substrate, delimiting the thin layer between the buried brittle plane and the intermediate layer; and
   depositing an additional layer of polycrystalline silicon carbide at a temperature higher than 1000° C. on the intermediate layer, the intermediate layer and the additional layer forming the carrier substrate, the initial substrate separating along the buried brittle plane during the deposition of the additional layer.

2. The method of claim 1, wherein depositing the intermediate layer and depositing the additional layer comprise depositing the intermediate layer and the additional layer using chemical vapor deposition at a temperature between 1000° C. and 1600° C.

3. The method of claim 2, wherein depositing the intermediate layer and/or depositing the additional layer comprises using chlorinated precursors in the chemical vapor deposition.

4. The method of claim 3, wherein, upon completion of depositing the intermediate layer, the thickness of the intermediate layer is greater than or equal to 3 microns.

5. The method of claim 4, wherein the implanted light ionic species are chosen from hydrogen and/or helium.

6. The method of claim 5, wherein the implanted light ionic species are implanted at an energy between 260 keV and 2000 keV, and at a dose between $5^E16$/cm$^2$ and $1^E17$/cm$^2$.

7. The method of claim 6, further comprising deoxidizing a front surface of the initial substrate before depositing the intermediate layer on the front surface of the initial substrate.

8. The method of claim 2, wherein depositing the intermediate layer and the additional layer a temperature between 1000° C. and 1600° C. comprises depositing the intermediate layer and the additional layer at a temperature between 1200° C. and 1600° C.

9. The method of claim 1, wherein depositing the intermediate layer and/or depositing the additional layer comprises depositing the intermediate layer and/or the additional layer using chemical vapor deposition with chlorinated precursors.

10. The method of claim 1, wherein, upon completion of depositing the intermediate layer, the thickness of the intermediate layer is greater than or equal to 3 microns.

11. The method of claim 10, wherein, upon completion of depositing the intermediate layer, the thickness of the intermediate layer is greater than or equal to 5 microns.

12. The method of claim 1, further comprising selecting the implanted light ionic species to comprise hydrogen and/or helium.

13. The method of claim 12, further comprising implanting the light ionic species at an energy between 260 keV and 2000 keV, and at a dose between $5^E16$/cm$^2$ and $1^E17$/cm$^2$.

14. The method of claim 1, further comprising deoxidizing a front surface of the initial substrate before depositing the intermediate layer on the front surface of the initial substrate.

* * * * *